United States Patent [19]

Nagazumi

[11] Patent Number: 5,701,260
[45] Date of Patent: Dec. 23, 1997

[54] MULTIPLIER USING CHARGE TRANSFER DEVICE

[75] Inventor: Yasuo Nagazumi, Tokyo, Japan

[73] Assignee: G.D.S. Co., Ltd., Tokyo, Japan

[21] Appl. No.: 463,779

[22] Filed: Jun. 5, 1995

[30] Foreign Application Priority Data

Aug. 3, 1994 [JP] Japan .................. 6-200255

[51] Int. Cl.$^6$ .................................................. G06J 1/00
[52] U.S. Cl. ............................................................. 364/606
[58] Field of Search ...................................... 364/606, 841

[56] References Cited

U.S. PATENT DOCUMENTS

| | | |
|---|---|---|
| 4,072,939 | 2/1978 | Heller et al. . |
| 4,161,783 | 7/1979 | Wrench, Jr. et al. ............... 364/606 |
| 4,458,324 | 7/1984 | Burke et al. ......................... 364/606 |
| 4,464,726 | 8/1984 | Chiang ................................. 364/606 |
| 4,584,657 | 4/1986 | Tiemann et al. .................... 364/602 |
| 4,625,293 | 11/1986 | Vogelsong et al. ................. 365/606 |
| 4,811,270 | 3/1989 | Nash .................................... 364/841 |
| 5,491,650 | 2/1996 | Barhen et al. ....................... 364/606 |
| 5,508,538 | 4/1996 | Fijany et al. ........................ 364/606 |

FOREIGN PATENT DOCUMENTS

| | | |
|---|---|---|
| 3224025 | 1/1984 | Germany . |
| 6-237173 | 8/1994 | Japan . |
| 6350453 | 12/1994 | Japan . |

*Primary Examiner*—Tan V. Mai

[57] ABSTRACT

A multiplier using a charge transfer device, broadly applicable to analog signal processing, digital-to-analog (D/A) conversion, or parallel image processing. The multiplier includes a charge transfer device with at least 8 independent potential wells arranged in a ring, and charge signal accumulators having at least one set of a plurality of independently controlled potential wells connected in serial to at least one of these potential wells on the ring.

6 Claims, 6 Drawing Sheets

MULTIPLIER USING CHARGE TRANSFER DEVICE

BACKGROUND OF THE INVENTION

1. Field of the Invention

The present invention is directed to a multiplier using a charge transfer device, applicable to analog signal processing, D/A conversion, or parallel image signal processors.

2. Description of the Prior Art

In the prior art, a variety of methods have been proposed and made practical for multiplying an analog signal and an another signal, including a multiplication-type D/A converter.

However, these methods encounter a problem of "trade-off between miniaturization and accuracy deterioration" inherent to analog signal processing and it has been argued that it is difficult to realize an integrated circuit of high density.

Moreover, in the prior art, in many cases, resistors and capacitors are often employed, and it is presumed that there is a limit as to the improvement of integration density, due to the heat generated by such a circuit.

As for methods for radically improving the said problems, Japanese application (Tokukaihei) No. 5-43262, Japanese application (Tokukaihei) No. 6-154514, or Japanese application (Tokukaihei) No. 6-151544, concerning the invention of the Inventor of the present application have been proposed, but these are apparatus wherein the division and the accumulation of an input signal in a charge domain is reiterated to realize a high accuracy D/A conversion with a simple circuit.

Problems to be Solved by the Invention

The present invention, therefore, provides a multiplier using a charge transfer device that can realize particular advantages through a smaller circuit composition, by further improving other inventions of the Inventor of the present application.

SUMMARY OF THE INVENTION

The invention is made considering the above-described problems and provides a multiplier using a charge transfer device, comprising at least 8 independent wells arranged in a ring configuration, and charge signal accumulators having at least one set of a plurality of independently controllable potential wells arranged in serial with at least one of these potential wells.

The present invention is directed to:

(1) a circuit for performing one-, two- and four-quadrant multiplication with a composition having an extremely small number of circuit devices; and (2) a multiplier array of high parallelity on an integrated circuit by using the input/output charge packet path as a part of a multiplier.

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENTS

Now, one example of the invention will be described with its function referring to the enclosed drawings.

Figure 1:
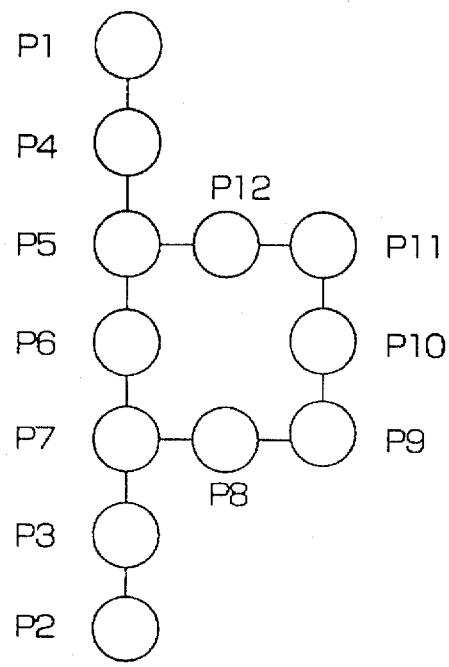
FIG. 1 is a composition diagram showing one embodiment of the present invention.
Figure 2:
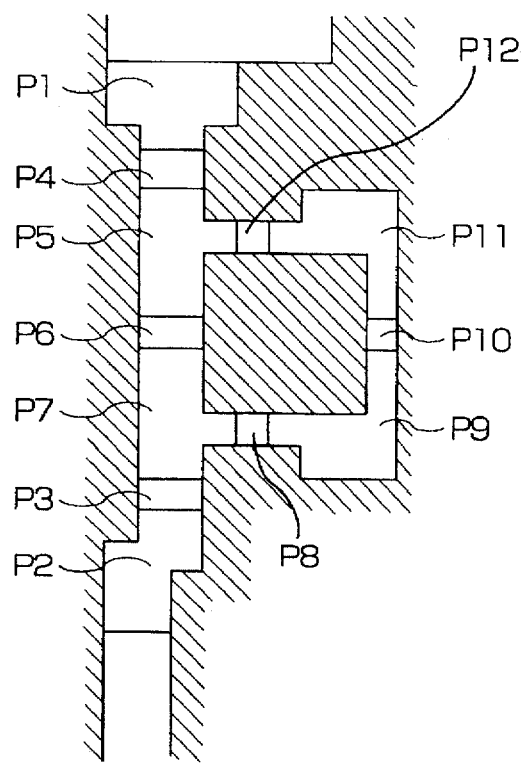
FIG. 2 is a embodiment diagram showing an example of realizing the composition diagram of FIG. 1 with a CCD.

FIG. 1 is a composition diagram illustrating a fundamental composition of one embodiment of the present invention. Circles in the drawing illustrate the arrangement of potential wells and lines interconnecting them show their connection while FIG. 2 is an embodiment diagram illustrating an example wherein this composition is realized by a charge-coupled device (referred to as "CCD" hereinafter). In the drawings, symbols P1 to P12 represent respective potential wells and the hatching in FIG. 2 illustrates the arrangement of channel stops.

In the potential wells P1–P12, similarly to a typical CCD, a depth (potential level is controlled by the potential applied from outside to the corresponding electrode, and when a plurality of adjacent potential wells are formed at the same time, a charge accumulated therein is held distributed over the whole series of wells, and when the intermediate wells diminish, the charge is divided between potential wells on both sides and held separately.

In other words, the illustrated serial potential wells P5, P6 and P7 compose a charge splitter that divide an input charge into two (2) charge packets and, though the control of the intermediate potential well P6, act to divide an initial charge held by these serial potential wells P5, P6 and P7 into two (2) charge packets on the potential wells P5 and P7 on both sides.

A coupling of a plurality of potential wells as described above will be designated, for instance, as potential wells (P5, 6, 7). This dividing operation is easily subjected to the effect of the area of respective potential well of an integrated circuit and, more particularly, the dividing accuracy is, in general, extremely insufficient when the circuit size becomes small.

The other potential wells P8 to P12 composing the ring are employed for improving the division accuracy by submitting the division result to further dividing and adding operations.

The mechanism of this precision improvement will not be described herein because Japanese application (Tokukaihei) No. 5-154514 and Japanese application (Tokukaihei) No. 6-151544 explain it in detail; eventually, almost one half of charges retained by the ring is output on the potential wells P5 and P7 and these charge signals shall be called analog bit signals.

One of these two charge signals remain on the ring, the other one is sequentially added to either charge accumulators of potential wells P1 and P2 according to the bit value of digital signals supplied separately beginning with the most significant bit (MSB) and, as the result, charges on the ring is discharged outside the ring half by half each time when the processing of 1 bit is accomplished, so analog bit signals remaining on the ring and analog bit signal to be transferred to charge accumulators will decrease sequentially as Q/2, Q/4, Q/8 and so on taking the input charge quantity as Q.

When the conversion for all bits is completed, the result is accumulated in the two charge accumulators of potential wells P1 and P2 and the difference of their charge quantity will be a value corresponding to the two quadrant multiplication result.

In general, the potential distribution of a system composed of a potential wells may be determined uniquely, as shown hereinafter, by n dimensional quantity of state vector V composed of state vPi of each respective potential well.

$$V = (vP1, cP2, vP3, \ldots vPn)$$

Here, if the process of sequential state vector variation from V1, V2, V3, Vj, ... is called "sequence SQ" and expressed by:

$$SQ = (Vj) = (vPij)$$

the whole operation procedure of the system can be expressed in SQ assembly.

To simplify the description, the variable vPij used herein will be explained taking the example of binary digital data of 0 or 1 but it is essentially the same for multivalue data or analog value, so long as their mutual magnitude relation is maintained.

Additionally, in the following description, $vPij=0$ means that the level of a potential well is shallow and $vPij=1$ the level is deep, respectively.

Tables 1—1, 2, 3, 4, 5 and 6 shown hereinafter, represent 6 types of sequences composing a practical operation for realizing the function of a two quadrant multiplier with the composition of FIG. 1

Figure 3:
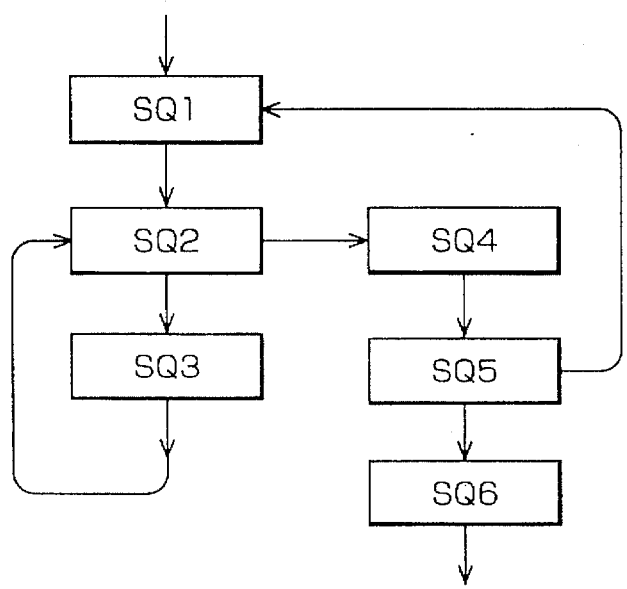
FIG. 3 is a diagram for explaining the procedure for performing the multiplication process of one embodiment of the present invention.

A charge signal input potential wells (P5, 6, 7) at the beginning of the multiplication will be eventually output as two charge signals of differential type, accumulated in two potential wells P1 and P2 applying these sequences SQ1 to SQ6 with the order shown in FIG. 3 and by executing sequential multiplication from the most significant bit (MSB).

Now, the procedure for executing multiplication process according to FIG. 3 will be described.

The sequence SQ1 shows the operation for roughly dividing the charge accumulated in (PS, 6, 7) into two equal parts. The resulting two charge packets are then divided by the processing of sequence SQ2 respectively into two equal parts for generating four (4) charge packets that are added two by two at the end of SQ2 and put together into two charge packets.

The processing of the sequence SQ2 having an effect of improving the accuracy of the operation to divide a charge into two equal parts, it is necessary to reiterate the execution for assuring a required accuracy level and the operation flow through the sequence SQ3 back to SQ2 illustrates this reiteration.

When the said sequence SQ2 is reiterated for the predetermined number of times, two charge packets having the predetermined accuracy, designated as analog bit signal hereinbefore, shall be held in potential wells (P5, 11, 12) and (P7, 8, 9) and in the next sequence SQ4, these charge packets are assembled in potential wells P5 and P7.

The sequence SQ5 executes D/A conversion or multiplication of 1 bit and selects two (2) different processes according to the input digital signal value.

In other words, when the digital bit is 1, the packet of the potential well P5 is added to P1 through the potential well P4 and when it is 0, the packet of the potential well P7 is added to P2 through the potential well P3.

The digital signals described here are supposed to be signed binary digits be supplied by 1 bit starting from the most significant bit (MSB).

After the completion of the sequence SQ5, if there are more bits to process, the processing is reiterated from the sequence SQ1 and when all bits are processed, the sequence SQ6 is executed before completing one (1) multiplication process.

Here, the processing of sequence SQ6 is a step for discharging the charge corresponding to the less significant bit (LSB) remaining at last on the ring and is not related to the essence of the operation, so it may be omitted.

As the result, a differential charge signal of the multiplication result is eventually output in the potential wells P1 and P2.

The above composition supposes that potential wells P5, P6 and P7 are used as the charge splitter, but using different sequences, a set of different potential wells P7, P8 and P9 may be used as charge splitter; using the same composition as FIGS. 1 and 2, different application embodiments may be devised and the operation mode described herein is only illustrative.

The example shown in FIG. 1 has a composition wherein two (2) charge signal accumulators comprising respectively potential wells P1, P4 and P2, P3 are connected to the ring comprising 8 potential wells P5 to P12; for instance, if the charge signal accumulator of potential wells P2, P3 is removed from this composition and the adding operation from the potential well P7 on the ring to P2 is replaced by "discard of charge signal retained by potential well P7" it works naturally as one-quadrant multiplier which is of simpler function.

While, in FIG. 1, a mode wherein two charge accumulators are connected to the potential wells P5, P7 is adopted, the embodiment of FIG. 1 is only illustrative because the similar two quadrant multiplication may be executed by using a convenient sequence even when, for instance, the connection to the potential well P7 is replaced by the connection to the potential well P9.

Figure 4:
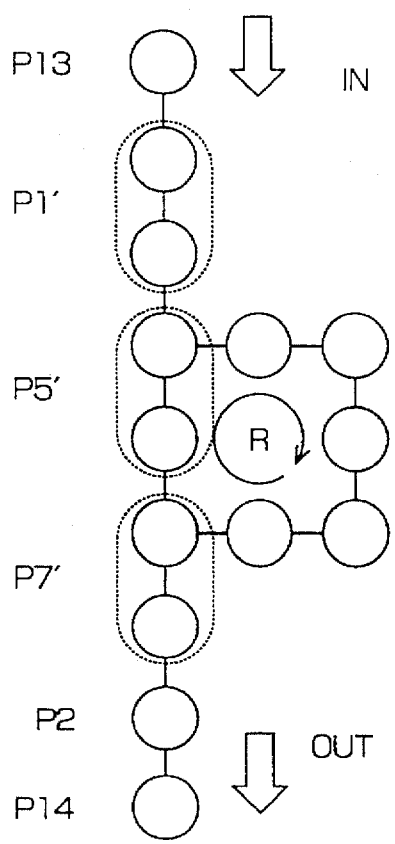
FIG. 4 is a composition diagram of a multiplier which commonly uses an input/output path, illustrating another embodiment of the present invention.
Figure 5:
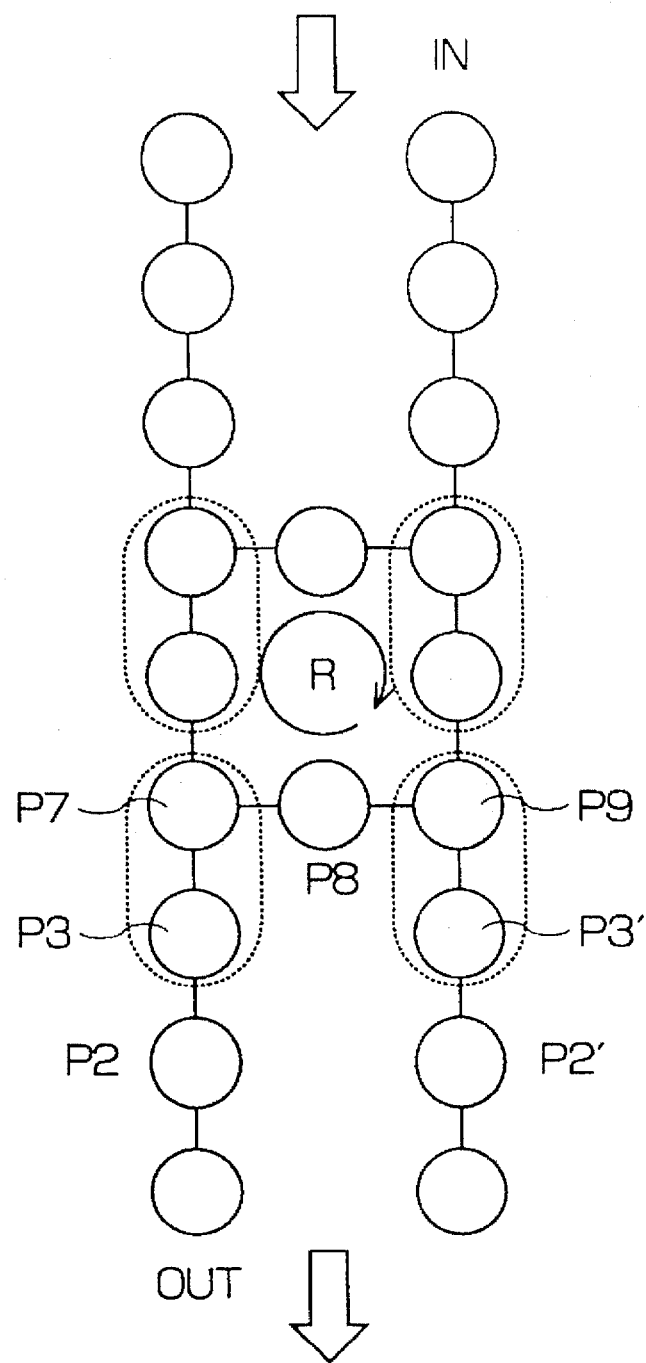
FIG. 5 is a composition diagram of a multiplier which commonly uses an input/output path, illustrating still another embodiment of the present invention.
Figure 6:
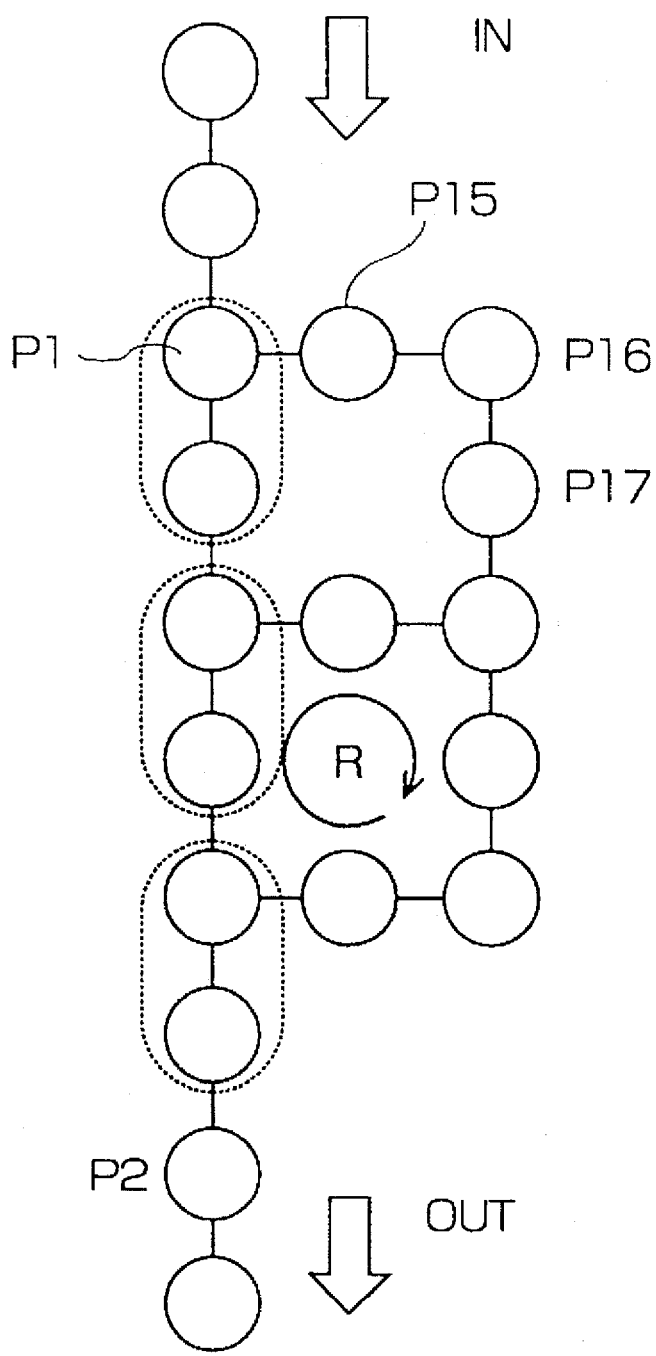
FIG. 6 is a composition diagram of a multiplier which commonly uses an input/output pass, illustrating another embodiment of the present inventions.

Next, FIGS. 4, 5 and 6 are examples of multipliers composed by combining data input/output channels, all of which are extremely appropriate for performing the parallel operations by setting a number of multipliers in series.

The example shown in FIG. 4 is composed by adding potential wells P13 and P14 for input/output to the composition of FIG. 1. A charge signal input from IN shown in FIG. 4 is transferred through a three-phase CCD comprising potential wells P13, P1', P5', P7', P2 and P14 and the multiplication result accumulated in potential wells P1' and P14 is output to the outside through OUT shown in the diagram simultaneously as the transfer of input charge signal.

Here, the potential wells P1', P5' and P7' shown in FIG. 4 represent respectively potential well couples designated by potential wells (P1, 4), (P5, 6) and (P7, 3) in FIG. 1. It is supposed that, during input/output operation, these paired three (3) potential wells are controlled to act respectively as one (1) potential well; however, an irregular three-phase driving adopting a driving method wherein potential wells P4, P6 and P3 are temporary delayed with respect to potential wells P1, P5 and P7 respectively may be a more advantageous design choice because it is effective to decrease transfer loss.

In the embodiment shown in FIG. 4, for starting the multiplication by performing input/output of the multiplier, data is shifted to the required location by executing the sequence of Table 2-1 shown hereinafter the required number of times and the sequence of Table 2—2 is executed once before passing to the operation shown in FIG. 3.

FIGS. 5 and 6 shown composition examples of a four-quadrant multiplier composed by using the composition shown in FIG. 1.

In the example illustrated in FIG. 5, two (2) input/output CCDs similar to the example of FIG. 4 are provided and positive/negative components of input and output signals, both taking the differential form, are supplied or discharged through the respective CCD. Different from the example of "FIG. 1, the charge splitter of this embodiment is composed of potential wells P7, P8 and P9, while the charge signal accumulator is composed of potential wells P2, P3; P2', P3'.

In this system, differential signals supplied from IN are subjected to the multiplication processing consequently from either side and the result is assembled on the charge signal accumulator to form an output signal, so the system is appropriate for the application requiring fast input/output given fewer stages of input/output CCD.

On the other hand, the example shown in FIG. 6 allows to realize the four-quadrant multiplication by executing the two-quadrant multiplication processing shown in FIG. 1 twice, by the simple addition of three (3) potential wells P15, P16 and P17 of the example shown in FIG. 4.

The additional three potential wells are provided for keeping one component of a differential input until the multiplication processing concerning the other component is accomplished. In other words, the one of the differential charge input inputted from IN passes temporary through the potential well P15 and is kept in the potential well P16 and the other is, as in the example of FIG. 1, multiplied by the two-quadrant multiplier on the ring R and the result is accumulated in the potential wells P1 and P2.

Then, the charge signal kept in the potential well P15 is supplied to the ring R through the potential well P17, the two-quadrant multiplication is executed, its result is also additionally accumulated in the potential well P1 and P2 and eventually, when the two-quadrant multiplication of both input signals is completed, its result are accumulated in the potential wells P1 and P2. Such composition has an advantage for assuring smooth processing when differential signals wherein positive and negative components are arranged alternatively are supplied as input.

In the four-quadrant multiplication, as the processing of the positive component and the negative component of the input are opposite in polarity, the logical polarity of digital signals will be reversed; for instance, to multiply a digital value of (1010) in respect of the positive component, it is necessary to multiply the digital value of (0101), it complement, in respect of the negative component. (Refer to Japanese application (Tokukaihei) No. 5-43262 for details).

Figure 7:
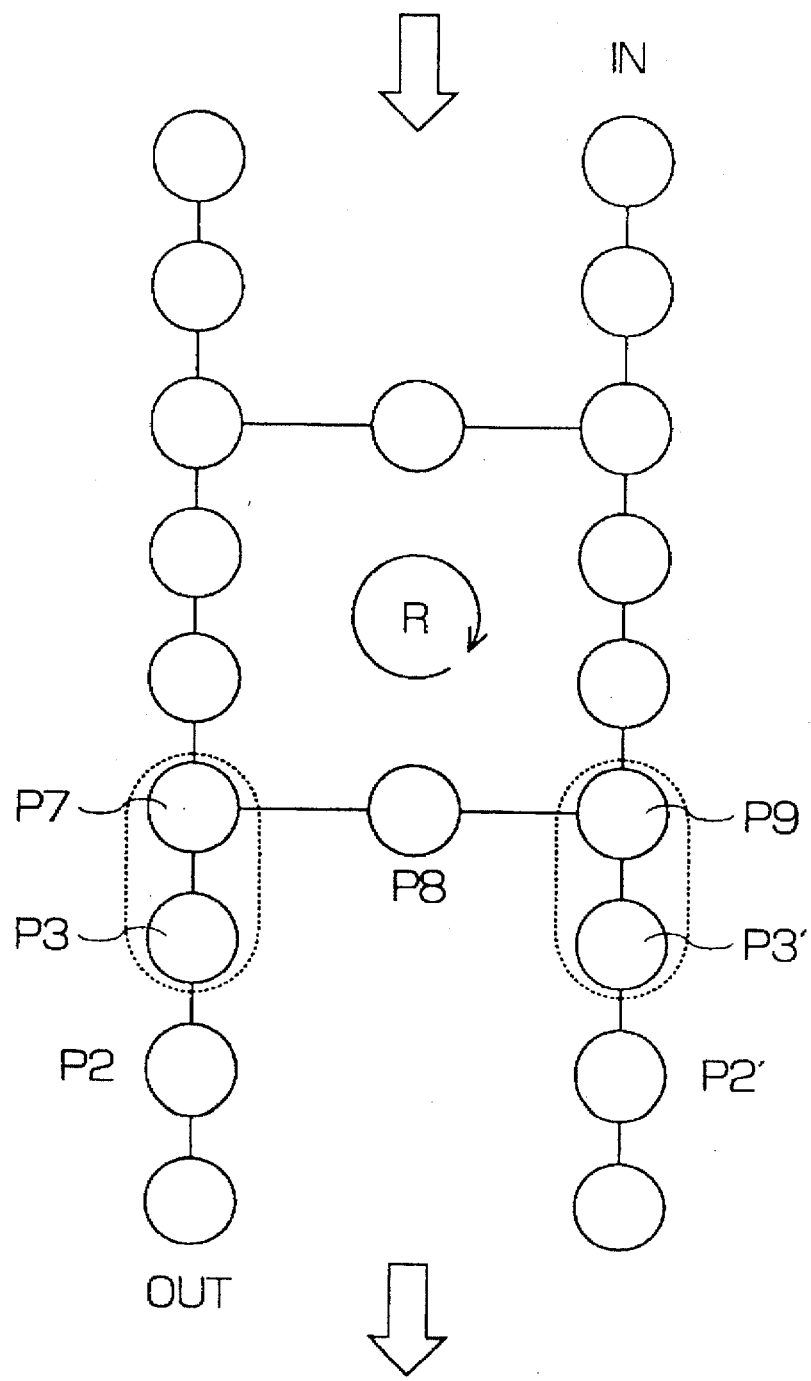
FIG. 7 is a composition diagram of a multiplier which a ring R three-phase CCD, based on the composition of FIG. 5.

FIG. 7 shows an example where the ring R is composed as three-phase CCD on the basis of the composition of FIG. 5. In this composition, though the circuit composition is relatively more complex than the multiplier of the mode shown in FIG. 1, it may afford an advantage of permitting a faster execution of multiplication processing, because data shift on the ring R may be executed smoother than in the examples of FIG. 4 to 6.

TABLE 1-1

SEQUENCE OF THE PRIMARY DIVISION (SQ1)

|   | P1 | P2 | P3 | P4 | P5 | P6 | P7 | P8 | P9 | P10 | P11 | P12 |   |
|---|----|----|----|----|----|----|----|----|----|-----|-----|-----|---|
| 1 | 1  | 1  | 0  | 0  | 1  | 1  | 1  | 0  | 0  | 0   | 0   | 0   |   |
| 2 | 1  | 1  | 0  | 0  | 1  | 0  | 1  | 0  | 0  | 0   | 0   | 0   | DIVISION |
| 3 | 1  | 1  | 0  | 0  | 1  | 0  | 1  | 0  | 0  | 0   | 1   | 1   |   |
| 4 | 1  | 1  | 0  | 0  | 0  | 0  | 1  | 0  | 0  | 0   | 1   | 1   |   |
| 5 | 1  | 1  | 0  | 0  | 0  | 0  | 1  | 0  | 0  | 0   | 1   | 0   |   |

TABLE 1-2

SEQUENCE OF SECONDARY DIVISION (SQ2)

|    | P1 | P2 | P3 | P4 | P5 | P6 | P7 | P8 | P9 | P10 | P11 | P12 |   |
|----|----|----|----|----|----|----|----|----|----|-----|-----|-----|---|
| 1  | 1  | 1  | 0  | 0  | 1  | 1  | 1  | 0  | 1  | 1   | 1   | 0   |   |
| 2  | 1  | 1  | 0  | 0  | 1  | 0  | 1  | 0  | 1  | 1   | 0   | 0   | DIVISION |
| 3  | 1  | 1  | 0  | 0  | 1  | 0  | 1  | 0  | 1  | 0   | 0   | 0   |   |
| 4  | 1  | 1  | 0  | 0  | 1  | 0  | 1  | 0  | 1  | 0   | 1   | 1   |   |
| 5  | 1  | 1  | 0  | 0  | 0  | 0  | 1  | 0  | 1  | 0   | 1   | 1   |   |
| 6  | 1  | 1  | 0  | 0  | 0  | 0  | 1  | 0  | 1  | 0   | 1   | 0   |   |
| 7  | 1  | 1  | 0  | 0  | 1  | 1  | 1  | 0  | 1  | 0   | 1   | 0   |   |
| 8  | 1  | 1  | 0  | 0  | 1  | 1  | 0  | 0  | 1  | 0   | 1   | 0   |   |
| 9  | 1  | 1  | 0  | 0  | 1  | 0  | 0  | 0  | 1  | 0   | 1   | 0   |   |
| 10 | 1  | 1  | 0  | 0  | 1  | 0  | 1  | 1  | 1  | 0   | 1   | 0   |   |
| 11 | 1  | 1  | 0  | 0  | 1  | 0  | 1  | 1  | 0  | 0   | 1   | 0   |   |
| 12 | 1  | 1  | 0  | 0  | 1  | 0  | 1  | 0  | 0  | 0   | 1   | 0   |   |
| 13 | 1  | 1  | 0  | 0  | 1  | 0  | 1  | 0  | 1  | 1   | 1   | 0   |   |
| 14 | 1  | 1  | 0  | 0  | 1  | 0  | 1  | 0  | 1  | 1   | 0   | 0   |   |
| 15 | 1  | 1  | 0  | 0  | 1  | 0  | 1  | 0  | 1  | 0   | 0   | 0   |   |

TABLE 1-2-continued

SEQUENCE OF SECONDARY DIVISION (SQ2)

|    | P1 | P2 | P3 | P4 | P5 | P6 | P7 | P8 | P9 | P10 | P11 | P12 |          |
|----|----|----|----|----|----|----|----|----|----|-----|-----|-----|----------|
| 16 | 1  | 1  | 0  | 0  | 1  | 0  | 1  | 0  | 1  | 0   | 1   | 1   |          |
| 17 | 1  | 1  | 0  | 0  | 0  | 0  | 1  | 0  | 1  | 0   | 1   | 1   |          |
| 18 | 1  | 0  | 1  | 0  | 1  | 1  | 1  | 0  | 1  | 0   | 1   | 0   |          |
| 19 | 1  | 1  | 0  | 0  | 1  | 1  | 1  | 0  | 1  | 0   | 1   | 0   |          |
| 20 | 1  | 1  | 0  | 0  | 1  | 0  | 1  | 0  | 1  | 0   | 1   | 0   | DIVISION |
| 21 | 1  | 1  | 0  | 0  | 1  | 0  | 1  | 1  | 1  | 0   | 1   | 0   | ADDITION |

TABLE 1-3

SEQUENCE FOR THE PREPARATION OF RE-EXECUTION OF THE SECOND DIVISION (SQ3)

|   | P1 | P2 | P3 | P4 | P5 | P6 | P7 | P8 | P9 | P10 | P11 | P12 |
|---|----|----|----|----|----|----|----|----|----|-----|-----|-----|
| 1 | 1  | 1  | 0  | 0  | 0  | 0  | 1  | 1  | 0  | 0   | 1   | 1   |
| 2 | 1  | 1  | 0  | 0  | 0  | 0  | 1  | 0  | 0  | 0   | 1   | 0   |

TABLE 1-4

SEQUENCE OF DIVISION TERMINATION (SQ4)

|   | P1 | P2 | P3 | P4 | P5 | P6 | P7 | P8 | P9 | P10 | P11 | P12 |
|---|----|----|----|----|----|----|----|----|----|-----|-----|-----|
| 1 | 1  | 1  | 0  | 0  | 1  | 0  | 1  | 1  | 0  | 0   | 0   | 1   |
| 2 | 1  | 1  | 0  | 0  | 1  | 0  | 1  | 0  | 0  | 0   | 0   | 0   |

TABLE 1-5

SEQUENCE OF ONE (1) BIT D/A CONVERSION (SQ5)

|    | P1 | P2 | P3 | P4 | P5 | P6 | P7 | P8 | P9 | P10 | P11 | P12 |
|----|----|----|----|----|----|----|----|----|----|-----|-----|-----|
| When digital input bit = 1 | | | | | | | | | | | | |
| 1  | 1  | 1  | 0  | 1  | 1  | 0  | 1  | 0  | 0  | 0   | 0   | 0   |
| 2  | 1  | 1  | 0  | 1  | 0  | 0  | 1  | 0  | 0  | 0   | 0   | 0   |
| 3  | 1  | 1  | 0  | 0  | 0  | 0  | 1  | 0  | 0  | 0   | 0   | 0   |
| When digital input bit = 0 | | | | | | | | | | | | |
| 1' | 1  | 1  | 1  | 0  | 1  | 0  | 1  | 0  | 0  | 0   | 0   | 0   |

TABLE 1-5-continued

SEQUENCE OF ONE (1) BIT D/A CONVERSION (SQ5)

|    | P1 | P2 | P3 | P4 | P5 | P6 | P7 | P8 | P9 | P10 | P11 | P12 |
|----|----|----|----|----|----|----|----|----|----|-----|-----|-----|
| 2' | 1  | 1  | 1  | 0  | 1  | 0  | 0  | 0  | 0  | 0   | 0   | 0   |
| 3' | 1  | 1  | 0  | 0  | 1  | 0  | 0  | 0  | 0  | 0   | 0   | 0   |

TABLE 1-6

SEQUENCE OF CONVERSION COMPLETED (SQ6)

|   | P1 | P2 | P3 | P4 | P5 | P6 | P7 | P8 | P9 | P10 | P11 | P12 |
|---|----|----|----|----|----|----|----|----|----|-----|-----|-----|
| 1 | 1  | 1  | 0  | 0  | 1  | 1  | 1  | 0  | 0  | 0   | 0   | 0   |
| 2 | 1  | 1  | 0  | 0  | 1  | 0  | 1  | 0  | 0  | 0   | 0   | 0   |
| 3 | 1  | 1  | 1  | 1  | 1  | 0  | 1  | 0  | 0  | 0   | 0   | 0   |
| 4 | 1  | 1  | 1  | 1  | 0  | 0  | 0  | 0  | 0  | 0   | 0   | 0   |
| 5 | 1  | 1  | 0  | 0  | 0  | 0  | 0  | 0  | 0  | 0   | 0   | 0   |

TABLE 2-1

SEQUENCE OF INPUT/OUTPUT MODE (SQ21)

|   | P13 | P14 | P1 | P2 | P3 | P4 | P5 | P6 | P7 | P8 | P9 | P10 | P11 | P12 |
|---|-----|-----|----|----|----|----|----|----|----|----|----|-----|-----|-----|
| 1 | 0   | 1   | 1  | 1  | 1  | 0  | 0  | 1  | 1  | 0  | 0  | 0   | 0   | 0   |
| 2 | 1   | 0   | 1  | 1  | 1  | 1  | 1  | 0  | 0  | 0  | 0  | 0   | 0   | 0   |
| 3 | 1   | 1   | 0  | 0  | 0  | 1  | 1  | 1  | 1  | 0  | 0  | 0   | 0   | 0   |

TABLE 2-2

SEQUENCE OF D/A CONVERSION PREPARATION (SQ22)

| P13 | P14 | P1 | P2 | P3 | P4 | P5 | P6 | P7 | P8 | P9 | P10 | P11 | P12 |                 |
|-----|-----|----|----|----|----|----|----|----|----|----|-----|-----|-----|-----------------|
| 0   | 0   | 0  | 0  | 0  | 0  | 0  | 0  | 0  | 0  | 0  | 0   | 0   | 0   | INPUT COMPLETED |

Figure 8:
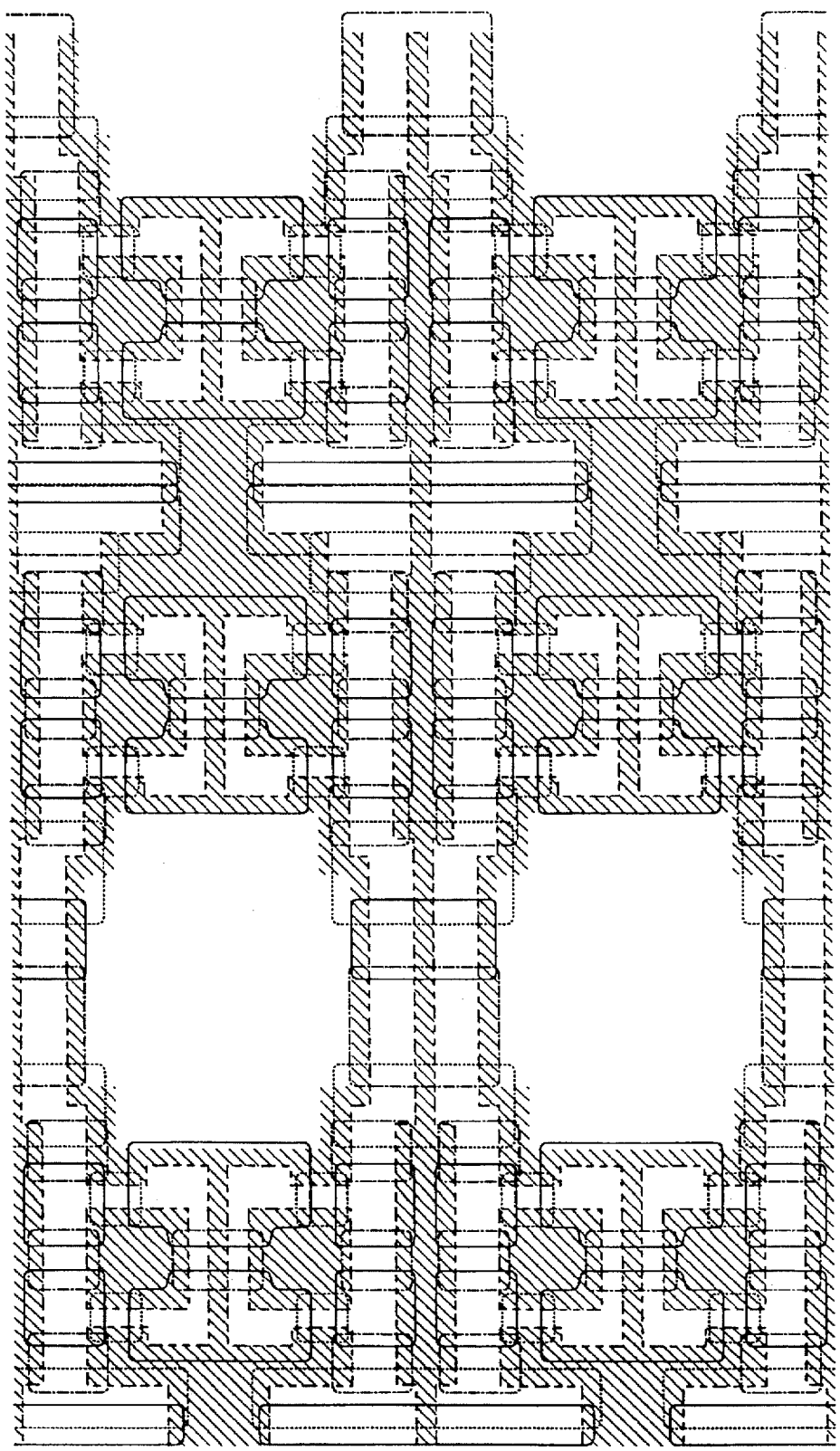
FIG. 8 is a embodiment diagram showing an example circuit of integrating 12 CCD multipliers in FIG. 2.

FIG. 8 shows that the composition of the present invention is extremely appropriate for the composition of integrated circuit, by illustrating a diagram of an embodiment of the circuit, wherein 12 CCD multipliers' of the tape shown in FIG. 2, are integrated.

In the diagram, hatching indicate channel stops. Polygons whose corners are rounded represented by solid line, broken line or dashed line indicate respectively the overlap electrode of the first, the second and the third layer.

As illustrated in FIG. 8, 12 multipliers are arranged very compactly and the shift register for supplying them with an input charge signal or discharging their output signal may take a simple linear form.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

I claim:

1. A multiplier using a charge transfer device comprising:

at least eight independent potential wells arranged in a ring which store multiplicand input charge signal packets prior to beginning a multiplication operation wherein each of said at least eight independent potential wells is controlled by voltage signal sequences, determined by digital multiplier input data; and at least one charge signal accumulator, having a set of independently controlled potential wells, connected in series to at least one of said at least eight independent potential wells in the ring, wherein said at least one charge signal accumulator collects and accumulates charge signal packets to selectively form a multiplication result output signal.

2. The multiplier of claim 1 wherein:

three of said at least eight independent potential wells constitute a charge splitter.

3. The multiplier of claim 1 wherein:

a selective adding operation of an analog bit signal generated on the ring is performed by a selective charge transfer in response to an input digital bit signal, from said at least eight independent potential wells arranged in the ring, with regard to at least one charge signal accumulator arranged in series on the ring.

4. The multiplier of claim 3, further comprising:

two (2) charge signal accumulators arranged in series with the ring, wherein a selective data adding operation of an analog bit signal generated on the ring is performed by one of the charge signal accumulators, in response to an input digital bit signal, from said at least eight independent potential wells constituting the ring.

5. The multiplier of claim 4, wherein:

multiplication processing by an input digital signal and by its complementary binary signal is performed separately, for each of a pair of charge signals composing a differential signal.

6. The multiplier of claim 1 wherein:

a transfer of input/output charge signals is performed, utilizing at least a portion of said at least eight independent potential wells.

* * * * *